United States Patent [19]

McKiel, Jr. et al.

[11] Patent Number: 4,915,795

[45] Date of Patent: Apr. 10, 1990

[54] PLATED-THROUGH HOLE PLUGS FOR ELIMINATING SOLDER SEEPAGE

[75] Inventors: Frank McKiel, Jr., Dallas; David Garms, Richardson, both of Tex.

[73] Assignee: Rockwell International Corporation, El Segundo, Calif.

[21] Appl. No.: 313,842

[22] Filed: Feb. 23, 1989

[51] Int. Cl.$^4$ .............................................. C25D 5/02
[52] U.S. Cl. ..................... 204/15; 174/266; 427/97
[58] Field of Search ............ 174/68.5; 427/97; 204/15

[56] References Cited

U.S. PATENT DOCUMENTS

| | | | |
|---|---|---|---|
| 3,264,402 | 8/1966 | Shaheen et al. | 174/68.5 |
| 3,464,855 | 9/1969 | Shaheen et al. | 174/68.5 |
| 3,471,631 | 10/1969 | Quintana | 174/68.5 |
| 4,191,789 | 3/1980 | Brown et al. | 174/68.5 X |
| 4,566,186 | 1/1986 | Bauer et al. | 427/97 X |
| 4,642,160 | 2/1987 | Burgess | 427/97 X |
| 4,743,710 | 5/1988 | Shieber et al. | 174/68.5 |
| 4,789,760 | 12/1988 | Koyama et al. | 174/68.5 |

Primary Examiner—Morris H. Nimmo
Attorney, Agent, or Firm—Bruce C. Lutz; V. Lawrence Sewell; H. Fredrick Hamann

[57] ABSTRACT

A process is illustrated to provide plated through holes for connecting between opposite sides of a circuit board such as an insulating ceramic substrate while maintaining a smooth surface on the circuit side to facilitate the process of defining the circuit pattern. The plated-through hole process is designed to uniformly cap or plug all of the plated-through holes to prevent solder from the backside from flowing through the holes to the circuit side and damaging (short-circuitry adjacent paths) the finished product.

6 Claims, 1 Drawing Sheet

PLATED-THROUGH HOLE PLUGS FOR ELIMINATING SOLDER SEEPAGE

THE INVENTION

The present invention is generally related to circuit board manufacturing techniques. It is more specifically related to an approach in plating vias or holes in a ceramic or other circuitry substrate to provide electrical connection from one side of the substrate to the opposite while maintaining a flush surface with the circuit side of the ceramic board. Even further, the invention relates to the concept of approaching the plating process in such a manner that not only are the sides of the holes plated, but the hole is capped on the circuit side whereby the entire circuit side surface of the substrate is flush for the metallization and circuit defining processes.

BACKGROUND

In designing high frequency circuits, it is usually desirable to obtain "solid" ground connections which present a low impedance both at DC and at high frequencies. This is obtained in some instances by metallizing the back of the circuit board to provide a backplane which is grounded by soldering the backplane to a good ground and/or heat sink. The connection from the circuit side of the substrate to the backplane may be made by wrap around metallization. However, the use of wrap around edge metallization limits the number of substrates that can be produced from a single chip and the grounding is less than ideal if there are many connections to be made and especially if these connections extend physically a long distance from the edge of the chip. It is much more desirable to have holes in the circuit board which provide a direct connection from the circuit side to the backplane side. Such direct connections vastly reduce circuit complexity but introduce new problems. If mere plated-through holes are utilized, not only does solder flow from the backplane side to the circuit side with resultant damage to the closely spaced circuit paths, but some of the prior art techniques have left the circuit board with an uneven surface and the holes and/or the uneven surface have caused problems with subsequent metallization processes.

The present invention attempts to solve these problems by performing the plating in such a fashion that the circuit side of the substrate remains flush due to a cap which is formed at the circuit side of the plate hole and this cap in addition to providing a smooth surface prevents the flow of solder when the substrate is being soldered to a heat sink or grounding device.

It is thus an object of the present invention to provide an improved plated hole process and resulting improved product.

Other objects and advantages of the present invention will be apparent from a reading of the specification and appended claims in conjunction with the drawings wherein:

FIG. 1 is a cross-section of an insulative substrate in a plating solution along with the electrodes designed in accordance with the present concepts to produce a plated plug in the substrate opening; and FIG. 2 is a view of a portion of a finished product incorporating the capped plated-through hole for connecting circuitry on one side of the substrate to the backplane on the opposite side.

DETAILED DESCRIPTION

Figure 1:
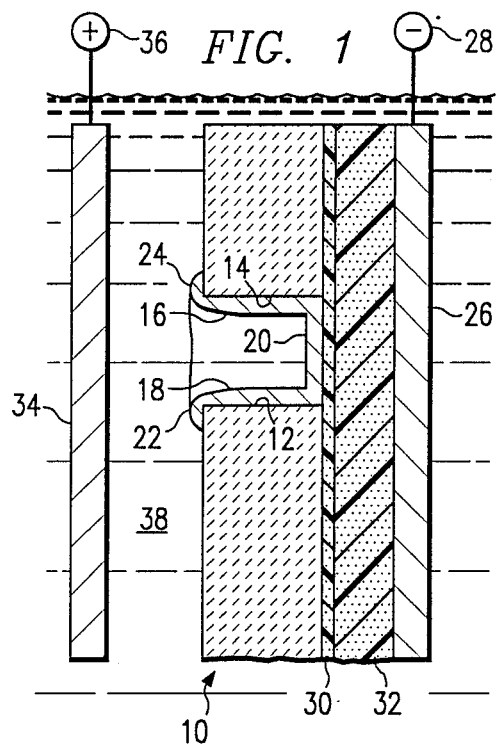

In FIG. 1 an insulating substrate is designated as 10 and a portion of a substrate with a hole or via having walls 12 and 14 are shown. While two walls are shown, these are merely opposite sides of a usually cylindrical hole which hole is typically between 10 and 20 mils in diameter. Thus, the via is cylindrical in shape and is covered by plating compound which is typically copper. The copper plating is shown as having a portion 16 attached to wall 14 and a portion 18 attached to wall 12 and a cap 20 which is flush with a circuit side of the substrate 10. While the substrate 10 can be any of many types of substrates, one type used in the present invention was alumina. The plating material will sometimes extend past the bottom edge of the substrate 10 to form the ridges 22 and 24. A cathode or rigid electrode designated as 26 is shown connected to a negative power source 28. A membrane 30 and a compliant section 32 of the electrode are sandwiched between the rigid portion 26 and the circuit side surface of the substrate 10. In one embodiment of the invention, the membrane 30 was carbon-filled polyethylene and was approximately four mils in thickness. The compliant portion 32 in one embodiment of the invention was carbon-doped polyurethane and in another usable embodiment was a thin layer of steel wool. The composite product of the substrate 10 and the associated electrode parts 26, 30 and 32 are placed in a plating solution generally designated as 38 along with a positive electrode 34 which is connected to a positive potential 36.

Figure 2:
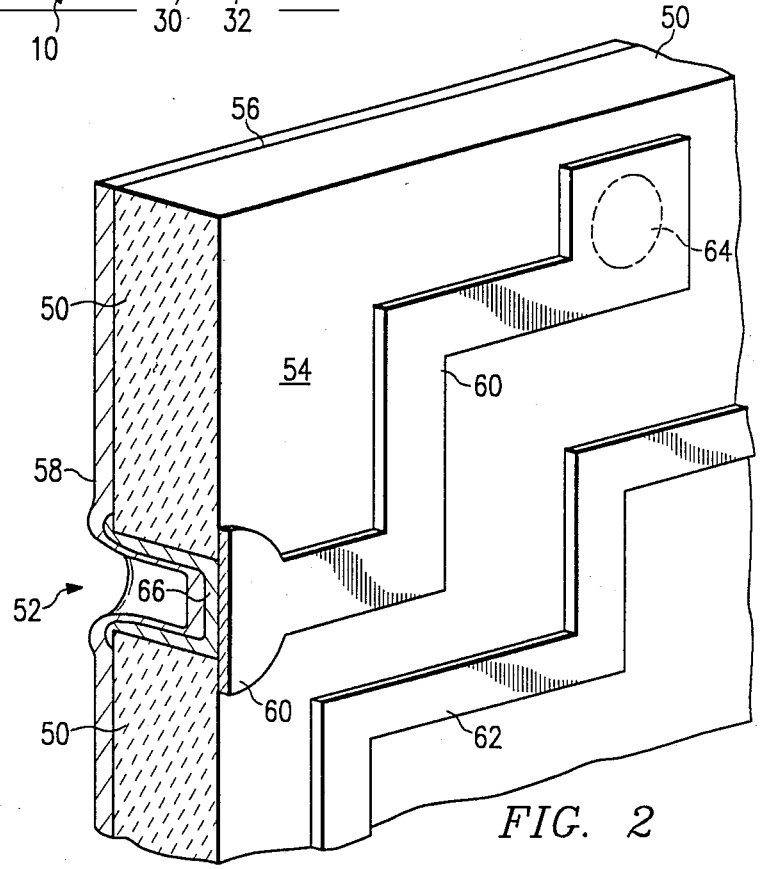

In FIG. 2 a substrate 50 is shown with a via generally designated as 52 and having a circuit side designated as 54 and a backside or backplane side designated as 56. Metallization 58 covers a majority of the backplane side including the capped vias. On the circuit side, a first circuit path is designated as 60 and a second circuit path is designated as 62. A second via is indicated on circuit path 60 by a dash line 64. Within the via 52 is a plated cap 66. The metallization material 58 typically is extremely thin and in one embodiment of the invention was approximately 24,000 angstroms. The size of the metallization or plating material 58 has been greatly exaggerated in thickness relative the substrate 50 for purposes of illustration. It will be noted that the metallization 58 is much thinner on the walls of the capped plug 66 than it is on the surface of the substrate or on the cap area of the plug. This is because the sputtering technique or approach normally used to provide the metallization operates more effectively on a surface perpendicular to the source than on a surface that is parallel to the movement of the molecules from the source to the target.

OPERATION

The basic operation of the present inventive concept is very straightforward once conceived and merely comprises placing a cathode on one side of an insulating substrate containing holes, passageways or vias in the substrate, inserting the combined substrate cathode and an anode in a plating solution and applying a potential to the electrodes until enough material is deposited in the opening to form a capped plug. The remaining steps to obtain a finished circuit board with conductive paths and backplane are substantially straightforward metallization and circuit path definition steps using photolithographic techniques.

If the surface of the substrate is very flat, the cathode may be just a piece of flat material such as stainless steel which is secured to one side of the substrate. However, if the surface of the substrate is not flat and a non-compliant cathode is used, the cap portion will protrude into the gaps where the gaps are adjacent the openings. If the extra step of grinding or polishing the surface to make it smooth or flush again is not objectionable, a non-compliant cathode may be used to perform the desired objective of a capped conduit extending through the substrate.

Since the substrate is typically not perfectly flat, the compliant cathode is normally required to provide an acceptable surface on the circuit side of the substrate for further processing without the requirement for additional processing steps such as grinding the circuit surface smooth before metallization and photoresist techniques are completed.

It should be noted that there is no requirement that the legs such as 16 and 18 of FIG. 1 extend past the surface of the substrate in the manner shown by extensions 22 and 24 of FIG. 1. It is merely sufficient that the legs 16 and 18 extend a substantial way down the sides 12 and 14 from the cap 20. When metallization is applied in the form of sputtering or other techniques, there will be sufficient material deposited within the remaining opening of the via to establish contact from the plug to the backplane.

A further advantage of the capped plugs over that previously mentioned, is that the circuit boards are typically handled using vacuum-type pickup devices. When the holes are not capped, the pickup devices lose their vacuum holding capability. Thus, the cap not only facilitates the circuit definition process and lowers the defective circuit rejection rate but facilitates the mechanical handling of the devices.

While the present invention has been described using certain materials for the insulator, a compliant cathode and the plating solution, the invention lies in the concept of having a cathode contiguous a non-metallized substrate to form a capped circuit in any openings in the substrate to facilitate an electrical connection from one side of the board to the other while preventing the passage of foreign materials from one side of the board to the other such as solder and/or for establishing a smooth surface on the circuit side for circuit production techniques such as metallization and photoresist circuit definition.

We therefore wish to be limited not by the specific embodiment disclosed but only by the scope of the appended claims wherein we claim:

1. A method of electrically inter-connecting conductive material on opposite sides of an insulative circuit board comprising the steps of:
   forming a composite cathode comprising:
     a non-adherent membrane;
     a rigid cathodic plate, and
     electrically conductive compliant material intermediate said membrane and said plate;
   forceably securing the non-adherent membrane side of said composite cathode to one side of a circuit board containing vias; and
   placing said composite cathode and circuit board in an activated copper plating bath until concave cylindrical plugs are formed in the vias.

2. The method of conductively plating and closing off vias in an insulating substrate in a flush manner on one surface of said substrate comprising the steps of:
   securing a thin non-adherent surface of a compliant cathode to a substrate, having vias between opposite sides of the substrate, on the side of the substrates required to have a smooth surface;
   immersing the cathode and substrate in a plating solution; and
   electrically energizing a plating solution-cathode potential until the vias are closed off.

3. The method of forming an electrical path for connecting conductive material on opposite sides of a substrate and establishing a smooth surface on one side of said substrate comprising the steps of:
   forming at least one opening in a substrate;
   securing a non-bondable compliant electrode to said one side of said substrate;
   placing the substrate and electrode in a plating solution;
   applying a potential between said electrode and the plating solution until plated material extends to opposite sides of the opening and the previously open area is closed.

4. Preventing solder flow through electrically connecting vias in substrate means comprising the steps of:
   drilling vias in a substrate;
   securing a non-adherent compliant electrode to the side of said substrate opposite the side to be soldered; and
   conductively plating said substrate until cylindrical plugs with a U-shaped cross-section are formed in the vias.

5. The method of forming a conductive pathway through an insulative substrate comprising, the steps of:
   securing an electrode having a conductive compliant surface to a first side of an insulative substrate required to have a smooth surface wherein a membrane of material that will not bond to plating material is situated between the compliant surface of said electrode and the insulative substrate;
   placing the combination of electrode and substrate in a plating solution; and
   passing current through the membrane between the plating solution and the electrode until a plated plug is formed in any openings extending from said first side to the opposite side of said substrate.

6. A method of depositing metal in a passage through an electrically insulative substrate comprising the steps of:
   positioning a cathode adjacent at least one opening of a passage on one side of an insulator;
   immersing the insulative substrate and cathode in an electroplating bath such that the end of said passage opposite the end associated with said cathode is contiguous an anode residing in the electroplating bath; and
   applying a potential to the electrodes such that metal deposition is initiated at the cathode end of the passage and accumulates in said passage whereby the plated metal conforms to the shape of the passage.

* * * * *